(12) United States Patent
Lee

(10) Patent No.: US 12,550,561 B2
(45) Date of Patent: Feb. 10, 2026

(54) LIGHT-EMITTING DISPLAY DEVICE AND METHOD OF MANUFACTURING THE SAME

(71) Applicant: LG Display Co., Ltd., Seoul (KR)

(72) Inventor: Sang Hoon Lee, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 416 days.

(21) Appl. No.: 18/353,068

(22) Filed: Jul. 15, 2023

(65) Prior Publication Data

US 2024/0032360 A1   Jan. 25, 2024

(30) Foreign Application Priority Data

Jul. 25, 2022   (KR) .......................... 10-2022-0091794

(51) Int. Cl.
  *H10K 59/131*   (2023.01)
  *H10K 59/12*   (2023.01)
  (Continued)

(52) U.S. Cl.
  CPC ....... *H10K 59/131* (2023.02); *H10K 59/1201* (2023.02); *H10K 59/122* (2023.02);
  (Continued)

(58) Field of Classification Search
  CPC ............. H10K 59/131; H10K 59/1201; H10K 59/122; H10K 59/805; H10K 59/88;
  (Continued)

(56) References Cited

U.S. PATENT DOCUMENTS 10,998,395 B2   5/2021   Han et al.
2018/0006106 A1*   1/2018   Oh ..................... H10K 59/1213
(Continued)

FOREIGN PATENT DOCUMENTS

KR   10-2016-0127459 A   11/2016
KR   10-1878187 B1   7/2018
(Continued)

*Primary Examiner* — James R Greece
*Assistant Examiner* — Jose M Diaz
(74) *Attorney, Agent, or Firm* — Fenwick & West LLP

(57) ABSTRACT

A light-emitting display device is provided. In the light-emitting display device, an insulation stack is patterned to form an opening area in the insulation stack, and an overhang structure in the opening area. An auxiliary electrode is connected to a common electrode around the overhang structure, such that a voltage of the common electrode may be uniformed for each region, and a voltage drop may be prevented. And, an exposed sidewall of the insulation stack surrounding the opening area is covered with the protective electrode, such that exposure of the insulation stack may be prevented at the inside and the sidewall of the opening area and residue of the pixel electrode material may be prevented. In addition, an exposure of a non-uniform interface of the insulating stack is prevented during a process of forming the organic functional layer and the common electrode, so that the organic functional layer and the common electrode may be stably deposited and the coverage characteristics of the encapsulation layer after forming the light-emitting device may be improved.

20 Claims, 9 Drawing Sheets

(51) Int. Cl.
*H10K 59/122* (2023.01)
*H10K 59/80* (2023.01)
*H10K 59/88* (2023.01)
*H10K 71/00* (2023.01)
*H10K 102/20* (2023.01)

(52) U.S. Cl.
CPC .......... *H10K 59/805* (2023.02); *H10K 59/88* (2023.02); *H10K 71/621* (2023.02); *H10K 2102/20* (2023.02)

(58) Field of Classification Search
CPC .. H10K 59/1315; H10K 59/12; H10K 59/124; H10K 59/80516; H10K 59/80522; H10K 71/621; H10K 71/00; H10K 2102/20; H10K 50/81–82; H10K 50/84
See application file for complete search history.

(56) References Cited

U.S. PATENT DOCUMENTS

2020/0135838 A1   4/2020   Han et al.
2021/0408441 A1   12/2021  Lee et al.

FOREIGN PATENT DOCUMENTS

KR   10-2020-0049336 A   5/2020
KR   10-2021-0158617 A   12/2021

* cited by examiner

LIGHT-EMITTING DISPLAY DEVICE AND METHOD OF MANUFACTURING THE SAME

CROSS-REFERENCE TO RELATED APPLICATION

This application claims the benefit of Korean Patent Application No. 10-2022-0091794, filed on Jul. 25, 2022, which is hereby incorporated by reference as if fully set forth herein.

BACKGROUND OF THE INVENTION

Field of the Invention

The disclosure relates to a display device, and more particularly, to a light-emitting display device that has a connection structure connecting a common electrode to a wire inside an insulation stack hole and protects sidewalls of the insulation stack hole to improve reliability, and a method of manufacturing the same.

Discussion of the Related Art

With the advent of the information society, demand for various forms of display devices for displaying images is increasing.

A light-emitting display device that includes a light-emitting element in each pixel does not require a separate light source unit and thus is effective in realizing slimness or flexibility, and has an advantage of excellent color purity.

For example, an organic light-emitting diode (OLED) includes two different electrodes and a light-emitting layer interposed therebetween, wherein electrons generated from one electrode and holes generated from the other electrode are injected into the light-emitting layer, and the injected electrons and holes recombine to generate excitons. The excitons fall from an excited state to a ground state, thus causing light emission.

In the light-emitting display device, the light-emitting element included in the pixel has a configuration in which one of the two opposing electrodes is provided as a common electrode that is common to all the pixels. As the area increases, luminance non-uniformity may occur due to the difference in resistance between regions in the common electrode resulting from the difference in distance from a power supply. In addition, the resistance of the common electrode increases as the thickness of the common electrode is decreased to improve transparency of the common electrode, thus causing a voltage drop and thus variation or reduction of the current of the light-emitting element.

SUMMARY OF THE INVENTION

Accordingly, the present disclosure is directed to a light-emitting display device and a method of manufacturing the same that substantially obviate one or more problems due to the limitations and disadvantages of the related art.

In the light-emitting display device of the present disclosure, an overhang structure may be arranged in an interlayer insulating stack in a display area to connect a common electrode to an auxiliary wire, such that a uniform voltage may be applied to an entire area of the common electrode, and non-uniformity luminance may be prevented.

And, the auxiliary electrode may be arranged in the insulating stack to protect the sidewall of the insulation stack spaced apart from the overhang structure, such that a stable encapsulation structure in an upper part of the auxiliary electrode may be formed, and moisture permeation caused by residues of the pixel electrode material may be prevented.

Additional advantages, objects, and features of the disclosure will be set forth in part in the description which follows and in part will become apparent to those having ordinary skill in the art upon examination of the following, or may be learned from practice of the disclosure. The objectives and other advantages of the disclosure may be realized and attained by the structure particularly pointed out in the written description and claims hereof as well as the appended drawings.

In the light-emitting display device according to the present disclosure, an insulation stack is patterned to prepare an opening area in the insulation stack, and an overhang structure is applied to the opening area. By connecting the auxiliary electrode to the common electrode around the overhang structure, it is possible to uniform the voltage of the common electrode for each region and prevent voltage drop. In addition, by covering the exposed sidewall of the insulation stack surrounding the opening area with the protective electrode, it is possible to prevent exposure of the insulation stack around the opening area and residue of the pixel electrode material at the non-uniform interface, and thereby electrodes and wires are disposed without direct exposure of the insulation stack around the overhang structure, so that the organic functional layer and the common electrode may be stably deposited and the coverage characteristics of the encapsulation layer after forming the light-emitting element may be improved.

To achieve these objects and other advantages and in accordance with the purpose of the disclosure, as embodied and broadly described herein, a light-emitting display device includes an auxiliary wire on a substrate, an insulation stack having an opening area exposing a part of the auxiliary wire, an overhang structure spaced apart from the insulation stack in the opening area, and a protective electrode being spaced apart from the overhang structure and contacting a sidewall of the insulation stack surrounding the opening area.

In an aspect of the present disclosure, a method of manufacturing a light-emitting display device includes providing an auxiliary wire on a substrate, laminating a first insulating layer and a second insulating layer, patterning the second insulating layer and the first insulating layer to form an insulation stack having an opening area exposing a part of the auxiliary wire and a first structure spaced apart from the insulation stack in the opening area, patterning a protective electrode material to provide a protective electrode on a sidewall of the insulation stack surrounding the opening area, and forming an overhang structure in which the first insulating layer of the first structure is narrower than the lower area of the second insulating layer.

It is to be understood that both the foregoing general description and the following detailed description of the present disclosure are exemplary and explanatory and are intended to provide further explanation of the disclosure as claimed.

BRIEF DESCRIPTION OF THE DRAWINGS

The accompanying drawings, which are included to provide a further understanding of the disclosure and are incorporated in and constitute a part of this application, illustrate embodiment(s) of the disclosure and together with the description serve to explain the principle of the disclosure. In the drawings.

DETAILED DESCRIPTION OF THE INVENTION

Figure 1:
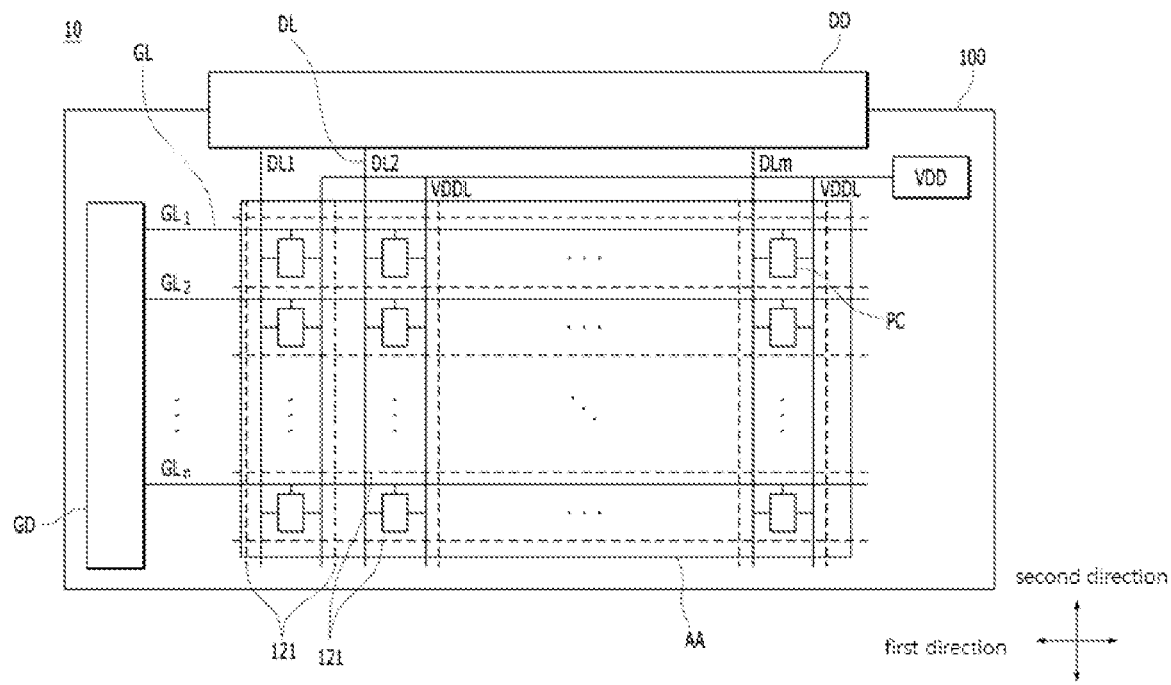
FIG. 1 is a plan view schematically illustrating a light-emitting display device according to the present disclosure.

Reference will now be made in detail to preferred embodiments of the present disclosure, examples of which are illustrated in the accompanying drawings. Wherever possible, the same reference numbers will be used throughout the drawings to refer to the same or like parts. In the following description of the present disclosure, detailed descriptions of known functions and configurations incorporated herein will be omitted when the same may obscure the subject matter of the present disclosure. In addition, the names of elements used in the following description are selected in consideration of clarity of description of the specification, and may differ from the names of elements of actual products.

The shapes, sizes, proportions, angles, numbers, etc. disclosed in the drawings for describing the embodiments of the present disclosure are illustrative, and thus the present disclosure is not limited to the illustrated elements. The same reference symbols refer to the same elements throughout the specification. In addition, in describing the present disclosure, when it is determined that a detailed description of related known technology may unnecessarily obscure the subject matter of the present disclosure, a detailed description thereof will be omitted. When "including", "having", "consisting", etc. are used in this specification, other parts may also be present, unless "only" is used. When an element is expressed in the singular, the case including the plural is included unless explicitly stated otherwise.

In interpreting an element, it is to be interpreted as including an error range even when there is no separate explicit description thereof.

In the case of a description of a positional relationship, for example, when a positional relationship between two parts is described using "on", "above", "below", "next to", etc., one or more other parts may be located between the two parts, unless "immediately" or "directly" is used.

In the case of a description of a temporal relationship, when a temporal precedence relationship is described using "after", "subsequent to", "next", "before", etc., the case of a discontinuous relationship may be included, unless "immediately" or "directly" is used.

Although "first", "second", etc. are used to describe various elements, these elements are not limited by these terms. These terms are merely used to distinguish one element from another. Accordingly, a first element mentioned below may be a second element within the spirit of the present disclosure.

Respective features of the various embodiments of the present disclosure may be partially or entirely combined or associated with each other, various forms of interlocking and driving are technically possible, and respective embodiments may be implemented independently of each other, or may be implemented in association with each other.

Hereinafter, a light-emitting display device and a method of manufacturing the same according to the present disclosure will be described with reference to drawings.

FIG. 1 is a plan view schematically illustrating a light-emitting display device according to the present disclosure.

As shown in FIG. 1, the light-emitting display device 10 of the present disclosure includes a substrate 100 having any one of various planar shapes such as a polygonal shape including a quadrangle shape, a circular shape, an ellipse shape, or an atypical shape, and at least one component on the substrate 100.

In addition, the substrate 100 is largely divided into a display area AA in the center thereof and an outer area outside the display area AA. The display area AA includes sub-pixels defined at the intersections of the gate lines GL in the first direction and the data lines DL in the second direction. In addition, a driving voltage line VDDL, to which a driving voltage is applied in the same direction as the data line DL, is further provided in the display area AA and the driving voltage line VDDL is connected to a thin film transistor (see TFT in FIG. 3), which is a component of a pixel circuit PC.

The pixel circuit PC may, for example, include a switching thin film transistor provided at the intersection of the gate line GL and the data line DL, a driving thin film transistor provided between the switching thin film transistor and the driving voltage line VDDL, and a light-emitting element (see 150 in FIG. 3) connected to the driving thin film transistor.

The switching thin film transistor is formed in the region where the gate line GL crosses the data line DL, and functions to select a corresponding sub-pixel, and the driving thin film transistor functions to drive the light-emitting element of the sub-pixel selected by the switching thin film transistor.

In addition, a gate driver GD configured to supply a scan signal to the gate line GL and a data driver DD configured to supply a data signal to the data line DL are provided in an area outside the display area AA. In addition, the driving voltage line VDDL may be provided with a power supply VDD in the outer area to receive a driving voltage from the power supply VDD or receive a driving voltage from the data driver DD.

Here, the gate driver GD, the data driver DD, and the power supply VDD may be directly embedded in the outer area of the substrate 100 when forming the thin film transistor of the display area AA. Alternatively, the gate driver GD, the data driver DD, and the power supply VDD may be formed by separately attaching a film or printed circuit board to the outer area of the substrate 100. Such a circuit driver is provided in an area outside the display area. For this purpose, the display area AA is defined inside the edge of the substrate 100.

In addition, the gate driver GD sequentially supplies a scan signal to the plurality of gate lines GL. For example, the gate driver GD functions as a control circuit to supply a scan signal to the plurality of gate lines GL in response to the control signal supplied from a timing controller (not shown).

In addition, the data driver DD supplies data signals to data lines DL1 to DLm selected from the data lines DL in response to the control signal supplied from an exterior component such as a timing controller (not shown). The data signals supplied to the data lines DL1 to DLm are supplied to sub-pixels selected by the scan signal whenever the scan signal is supplied to the gate lines GL to GLn. As a result, the sub-pixel is charged with a voltage corresponding to the data signal and emits light with a corresponding luminance.

Meanwhile, the substrate 100 may be an insulating substrate formed of a plastic, glass, ceramic, or the like. When the substrate 100 is formed of plastic, it may be slim and bendable and flexible. However, the material of the substrate 100 is not limited thereto and may include a metal and further include an insulating buffer layer on the side of the substrate 100 where the wire is formed.

In addition, the pixel may be defined by a set of a plurality of sub-pixels, for example, three or four sub-pixels emitting light of different colors.

Such a sub-pixel means a unit in which a specific type of color filter is formed or a light-emitting element can emit light of a certain color without a color filter. Colors defined by sub-pixels include red (R), green (G), and blue (B), and may optionally further include white (W), but the light-emitting display device of the present disclosure is not limited thereto.

The light-emitting display device 10 may be a top emission type, a bottom emission type, or a dual emission type in some cases.

In the light-emitting display device according to the present disclosure, the common electrode (see 153 in FIG. 3) is common to the display area AA and is integrated therewith. The common electrode may extend to the outside of the display area AA from the entire area of the display area AA and may be connected to the power supply in an area outside the display area AA so that the common voltage may be applied thereto.

Here, the auxiliary wire 121 may be provided in both first and second directions crossing each other, as shown in FIG. 1, or may be provided only in either one of the first and second directions. Here, a plurality of auxiliary wires 121 is provided in the display area AA, an overhang structure (see ST in FIG. 3) is formed on the auxiliary wires 121 in the first direction and/or the second direction with respect to each of the auxiliary wires 121, and the common electrode is connected to the auxiliary wire 121 around the overhang structure.

Meanwhile, as described above, the auxiliary wire 121 may be disposed on the same layer as any one of the gate line GL and the data line DL. Alternatively, the auxiliary wire 121 may be disposed on the same layer as the gate driver GD and the pad electrode provided in the data driver GD in the outer area.

The auxiliary wire 121 may be a single layer including any one selected from copper (Cu), molybdenum (Mo), aluminum (Al), chromium (Cr), silver (Ag), titanium (Ti), nickel (Ni), gold (Au), neodymium (Nd), tantalum (Ta), and tungsten (W), or an alloy including at least one of these metals, or a plurality of layers including at least one metal layer including this material. The auxiliary wire 121 is connected to the common electrode in the display area AA and functions to lower the resistance of the common electrode and to secure uniform luminance for each area.

Hereinafter, a connection structure between the auxiliary wire 121 and the common electrode and a peripheral structure according to an embodiment of the present disclosure will be described.

Figure 2:
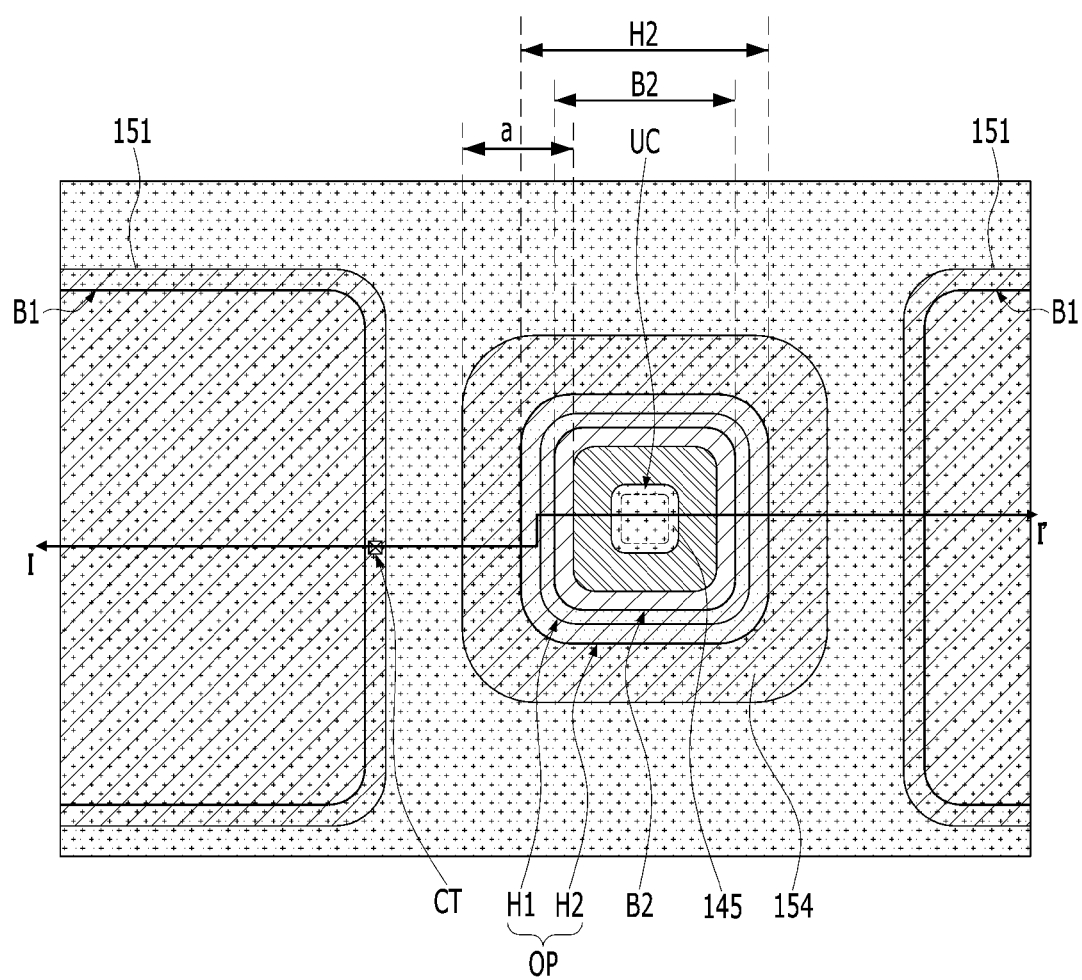
FIG. 2 is a plan view illustrating a light-emitting display device according to a first embodiment of the present disclosure.
Figure 3:
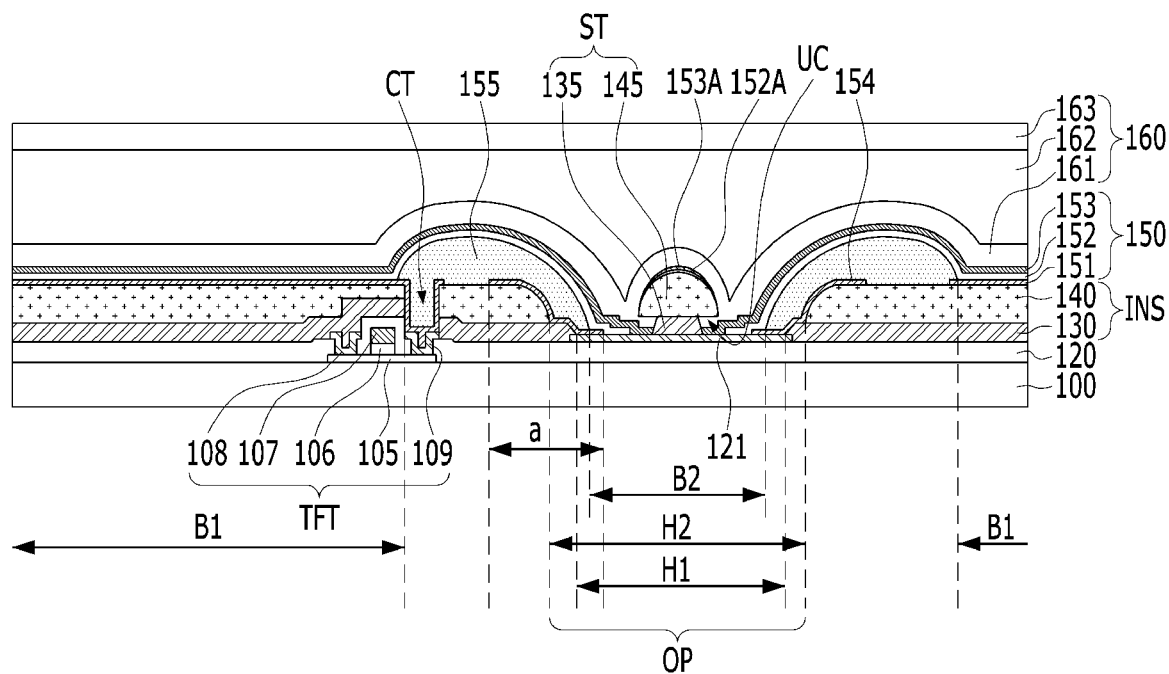
FIG. 3 is a cross-sectional view taken along I-I' of FIG. 2.

FIG. 2 is a plan view illustrating a light-emitting display device according to a first embodiment of the present disclosure, and FIG. 3 is a cross-sectional view taken along line I-I' of FIG. 2.

As shown in FIGS. 2 and 3, the light-emitting display device according to the first embodiment of the present disclosure includes an auxiliary wire 121 on a substrate 100, an insulation stack INS having an opening area OP exposing a part of the auxiliary wire 121, an overhang structure ST spaced apart from the insulation stack INS in the opening area OP, and a protective electrode 154 contacting a sidewall of the insulation stack INS spaced apart from the overhang structure ST and surrounding the opening area.

The insulation stack INS includes a first layer 130 having a first hole H1 in the opening area OP, and a second layer 140 having a hole wider than the first hole H1 on the first layer 130.

The first layer 130 of the insulation stack INS protects the thin film transistor TFT and is also referred to as a "passivation layer". The passivation layer is an inorganic insulating layer and may, for example, include a silicon oxide layer, a silicon nitride layer, or a silicon oxynitride layer.

In addition, the second layer 140 of the insulation stack INS functions to planarize an upper surface of an array structure including thin film transistors, and is also referred to as a "planarization layer" or an "overcoat layer". The upper surface of the second layer 140 is planarized so that the light-emitting element 150 formed in the subsequent process can be deposited with homogeneity on an even upper surface of the second layer 140. The second layer 140 may be formed of an organic material such as a photosensitive resin, polyimide resin, benzocyclobutene resin, or acrylate resin. Since the second layer 140 is disposed on the lower structure with a step and allows surface planarization, the second layer 140 is formed to a sufficient thickness greater than the first layer 130. For example, the second layer 140 may be formed to a thickness of not less than 1 μm and not more than 5 μm.

The overhang structure ST of the present disclosure is formed of the same stack as the insulation stack INS. A part of the insulation stack INS is removed to provide the opening area OP, through which the auxiliary wire 121 is exposed, and the overhang structure ST is provided on the auxiliary wire 121 inside the opening area OP. The opening area OP is formed by removing the insulation stack INS and the overhang structure ST is provided inside the opening area OP, so that the upper common electrode 153 may be connected on the plane to the auxiliary wire 121 at an edge of the overhang structure ST.

Meanwhile, the light-emitting element 150 of the present disclosure includes a pixel electrode 151, an organic functional layer 152 including at least a light-emitting layer, and a common electrode 153.

The pixel electrode 151 is provided to correspond to the emission portion (same as the area B1 of FIGS. 2 and 3) of each sub-pixel. The pixel electrodes 151 are spaced apart from each other in adjacent sub-pixels.

In addition, the organic functional layer 152 may further include a common layer in addition to the light-emitting layer. The common layer may include a hole transport common layer configured to inject and transport holes located below the light-emitting layer and an electron transport common layer configured to transport and inject electrons located above the light-emitting layer. In some cases, the organic functional layer 152 may have a structure including a plurality of stacks including a hole transport common layer, a light-emitting layer, and an electron transport common layer, and further including a charge generation layer between the stacks. The light-emitting layer and the common layer may include an organic material, but may further include a dopant such as a metal, metal compound or other component.

Each layer of the organic functional layer 152 and the common electrode 153 may be formed using a common mask exposing the entire area of the display area AA, rather than a fine metal mask divided into each emission portion of each sub-pixel. The light-emitting layer in the organic functional layer 152 may be selectively formed for each emission portion of each sub pixel through the fine metal mask or may be formed over the entire display area AA through a common mask, like the common layer.

For example, the pixel electrode 151 of the light-emitting element 150 formed on the insulation stack INS is formed on the insulation stack INS having the opening area OP. When the pixel electrode-forming material is left only on the pixel electrode 151 disposed on the insulation stack INS and is removed from the remaining area, the first layer 130 and the second layer 140 of the insulation stack INS formed of different materials have different slopes on the sidewall of the opening area OP, and the relatively thick second layer 140 has a large slope. For this reason, particles of the pixel electrode material may readily remain at the corner between the second layers 140 and the first layer 130 of the sidewall in the insulation stack INS. In this case, particles of the remaining pixel electrode material may cause non-uniform deposition of components formed in the subsequent process. In particular, after the formation of the organic functional layer 152, the common electrode 153 and the encapsulation layer structure 160 are formed by deposition at a low-temperature of 200° C. or less, preferably 100° C. or less, to prevent deformation thereof. In the film formation environment of low-temperature deposition, deposition uniformity is deteriorated in areas where particles are left and in the surroundings, and in severe cases, stable deposition of the common electrode 153 and the encapsulation layer structure 160 in the opening area OP of the insulation stack ST is difficult.

The light-emitting display device of the present disclosure has one feature to solve this phenomenon. As shown in FIGS. 2 and 3, a protective electrode 154 is further formed on the sidewall of the insulation stack INS surrounding the opening area OP, to protect the sidewall of the insulation stack INS with the protective electrode 154, prevent the accumulation of particles at the boundary between the sidewall of the insulation stack INS and another material, provide deposition characteristics similar to that of the surface of the pixel electrode 151, and to thereby secure stable encapsulation characteristics even inside the opening area OP. Therefore, the protective electrode 154 can prevent exposure of the side of the second layer 140 of the insulation stack INS during the process, and prevent moisture or hydrogen from entering the side of the vulnerable second layer 140. Accordingly, high-temperature, high-humidity reliability of the light-emitting display device may be improved. In addition, the protective electrode 154 provided on the sidewall of the insulation stack INS prevents the etched material from remaining at the corner of the opening area OP of the insulation stack INS, and prevents the area with poor etchant flowability from etching during the process.

As shown in FIGS. 2 and 3, the protective electrode 154 surrounds the opening area OP of the insulation stack INS and has a constant width of "a" over the sidewall, a part inside the sidewall, and an outside of the sidewall. In addition, the protective electrode 154 may be formed to extend from an uppermost portion of the sidewall to an upper part of the second layer 140 of the insulation stack INS. The protective electrode 154 is formed on the entire sidewall of the insulation stack INS surrounding at least the opening area OP, which gradually narrows toward the bottom, to prevent exposure of a part of the insulation stack INS that is vulnerable to moisture, and to protect the sidewall of the insulation stack INS having poor flowability. In addition, the end of the protective electrode 154 is in contact with the opening area OP and thus is adhered to the three layers of the second layer 140, the first layer 130, and the auxiliary wire 121 of the insulation stack INS to improve interfacial adhesion. In addition, as shown in FIG. 2, the protective electrode 154 may be present in the form of a closed loop having a width 'a' on a plane. When formed along the outer circumference of the opening area OP, the protective electrode 154 may have a different outside width. Even in this case, it is preferable that the protective electrode 154 be provided at all sidewalls of the insulation stack INS to protect the sidewalls of the insulation stack INS having poor etchant flowability.

As shown in FIG. 2, the first hole H1 of the lower first layer 130 in the first layer 130 and the second layer 140 of the insulation stack INS is narrower, and the upper second layer 140 is provided with a second hole H2 having a larger area. As shown in FIG. 3, when observed in a cross section, the opening area OP may have a step shape.

In addition, due to differences in material, the first layer 130 and the second layer 140 may have different slopes in the opening area OP and may have different critical dimensions at the interface therebetween. When the first layer 130 and the second layer 140 have different critical dimensions at the interface therebetween, the sidewall of the thick second layer 140 may have a greater slope. In the light-emitting display device of the present disclosure, the protective electrode 154 is provided on the sidewalls of the first layer 130 and the sidewalls of the second layer 140 surrounding the opening area OP of the insulation stack INS as well as the top of the first layer 130 exposed due to the critical dimension difference between the interfaces, to protect the overall structure of the exposed insulation stack INS of the opening area OP, and prevent the pixel electrode material in the form of particles from remaining in steep areas or areas where particles readily accumulate during the etching process.

Meanwhile, the overhang structure ST including the first pattern 135 and the second pattern 145 on the same layer as the first layer 130 and the second layer 140 of the insulation stack INS includes an undercut region UC in which the first pattern 135 is relatively further etched from the lower side of the second pattern 145 through an etching process of the additional second pattern 145 material after forming the opening area OP of the insulation stack INS.

In the undercut region UC at the bottom of the overhang structure ST, the common electrode 153 enters the undercut region UC more than the organic functional layer 152 so that the common electrode 153 can be directly electrically connected to the auxiliary wire 121. The auxiliary wire 121 is provided inside the display area AA and each of the plurality of auxiliary wires 121 in the display area AA has a connection portion between at least one auxiliary wire 121 and the common electrode 153, so that paths through which voltage is directly supplied to the common electrode 153 are formed at a plurality of locations within the display area AA, thereby preventing an increase in resistance of the common electrode 153 and a voltage drop.

Meanwhile, the auxiliary wire 121 is a wire to which a common voltage is applied and may be formed in a single layer or multiple layers. In addition, an auxiliary pattern having a size larger than the opening area OP is formed in a portion corresponding to the opening area OP of the insulation stack INS of FIG. 2, and may further include a wire in the form of a line extending in a vertical and/or horizontal line from the bottom or top. The auxiliary wire 121 may be provided on the same layer as at least one electrode constituting the thin film transistor TFT. Alternatively, the auxiliary wire 121 may be formed of the same metal layer as a light-blocking layer provided below the thin film transistor TFT to prevent external light from entering the thin film transistor TFT.

The upper surface of the auxiliary wire 121 exposed by the opening area OP of the insulation stack INS is preferably flat because uniform connection between the common electrode 153 and the auxiliary wire 121 can be formed around the overhang structure ST.

The first pattern 135 of the overhang structure ST is formed on the same layer as the first layer 130 of the insulation stack INS and is formed of an inorganic insulating film, the second pattern 145 is formed on the same layer as the second layer 140 and is formed of an organic insulating film, and the second pattern 145 may have a greater thickness than that of the first pattern 135.

The undercut area UC may be defined in an area where the first pattern 135 is further removed in the vertical direction than the second pattern 145, as shown in FIG. 3, and as shown in FIG. 2, it may be defined by the form of a closed loop at the edge of the second pattern 145. In order to secure the vertical height of the undercut region, the first pattern 135 and the first layer 130, which are formed on the same layer as needed, are formed of a plurality of layers of the same inorganic insulating material or different inorganic insulating materials so as to secure a constant thickness. Since the thickness of the first pattern 135 is formed to be greater than the thickness of the organic functional layer 152, in the undercut region UC defined by the difference in width between the second pattern 145 and the first pattern 135 by removing the first pattern material, the common electrode 153 on the organic functional layer 152 more easily enters the undercut region UC than the organic functional layer 152, and the common electrode 153 is directly connected to the auxiliary wire 121 in the undercut region UC.

Meanwhile, in the light-emitting display device of the present disclosure, a bank 155 having a first bank hole B1 exposing the pixel electrode 151 of the emission portion and the overhang structure ST and a second bank hole B2 exposing a part of the opening area OP including the overhang structure ST and the surrounding thereof is provided in the upper part of the insulation stack INS.

The bank 155 may be formed of an organic material such as a polyimide, acrylate, or benzocyclobutene resin.

In the light-emitting display device according to the first embodiment of the present disclosure, the second bank hole B2 is smaller than the opening area OP of the insulation stack INS, and the bank 155 around the second bank hole B2 is provided to cover the protective electrode 154 disposed on the sidewall of the insulation stack INS. In this case, a tip of the protective electrode 154 toward the center of the opening area OP may be exposed from the bank 155.

The protective electrode 154 is provided on the sidewall of the opening area OP, from which a portion of the insulation stack INS is removed, to protect the insulation stack INS on the sidewall of the opening area OP, and the bank 155 on the protective electrode 154 may protect the protective electrode 154 around the overhang structure ST. Here, the protective electrode 154 exposed from the bank 155 absorbs hydrogen generated in the encapsulation layer structure 160 entering the opening area OP in the insulation stack INS after the overhang structure ST and the light-emitting element 150 are formed, to prevent the effect of hydrogen on the light-emitting element 150 disposed on the first bank hole B1 or the thin film transistor under the insulation stack INS.

Meanwhile, the protective electrode 154 may be formed of a single layer or multiple layers. The protective electrode 154 may be formed on the same layer and of the same metal as the pixel electrode 151. Since the pixel electrode 151 may include a reflective electrode, the protective electrode 154 formed on the same layer as the pixel electrode 151 may include a reflective electrode. For example, the reflective electrode may include silver (Ag) or a silver alloy such as APC (Ag—Pd—Cu). The pixel electrode 151 may be formed as a single layer. Alternatively, the pixel electrode 151 may be formed as a multilayer structure. For example, the pixel electrode 151 may include a transparent electrode under and/or above the reflective electrode to adjust the interfacial matching with the organic functional layer 152 and the work function for hole injection. The transparent electrode layer may be formed of ITO (indium tin oxide), IZO (indium zinc oxide), ITZO (indium tin zinc oxide), or the like. In this case, the pixel electrode 151 and the protective electrode 154 may include a stacked structure of ITO/Ag (or silver alloy layer)/ITO. In some cases, the pixel electrode 151 and the protective electrode 154 may further include a highly conductive metal layer or a hydrogen-shielding metal layer on the lower side thereof. The highly conductive metal layer or the hydrogen-shielding metal layer, for example, includes any one metal selected from the group consisting of molybdenum, aluminum, chromium, gold, titanium, nickel, neodymium, or copper, or an alloy containing at least one of these metals. When the pixel electrode 151 and the protective electrode 154 include a highly conductive metal, a transparent electrode such as ITO, IZO, or ITZO may be further included at the lowermost side thereof.

As shown in FIG. 3, when the protective electrode 154 exposed from the bank 155 in the opening area OP includes a hydrogen-shielding electrode such as molybdenum, titanium, a molybdenum-titanium alloy layer, or a titanium nitride film, the effect of moisture and hydrogen generated in the open region OP during or after the formation of the organic functional layer 152, the common electrode 153, and the encapsulation layer structure 160, on the internal insulation stack INS can be more effectively prevented.

Meanwhile, the encapsulation layer structure 160 may include at least two or more inorganic encapsulation layers 161 and 163 and at least one organic encapsulation layer 162, and the organic encapsulation layer 162 may be provided between the inorganic encapsulation layers 161 and 163. The inorganic encapsulation layers 161 and 163 may prevent permeation of moisture from the outside and block the effect of moisture or hydrogen permeation into the light-emitting element 150, and the organic encapsulation layer 162 may prevent particles generated during the process from passing through the lower side to improve reliability of the light-emitting element 150 and the thin film transistor TFT.

The encapsulation layer structure 160 is formed after the light-emitting element 150 and is formed by deposition at a low temperature, preferably of 200° C. or less, more preferably 100° C. or less, to prevent deterioration of the organic functional layer 152 or the common electrode 153. The encapsulation layer structure 160 may be provided to prevent permeation of moisture or air from the outside and may be thicker than the insulating films 120, 130, and 140 on the substrate 200 disposed in a lower part. That is, the thicknesses of the inorganic encapsulation layers 161 and 163 may be greater than those of the interlayer insulating film 120 and the first layer 130, which are inorganic insulating films, and the organic encapsulation layer 162 may be thicker than the second layer 140, which is an organic insulating film.

In the light-emitting display device of the present disclosure, the lowermost inorganic encapsulation layer 161 of the encapsulation layer structure 160 enters the opening area OP in the insulation stack INS, and covers and protects the periphery of the overhang structure ST inside the opening area.

Meanwhile, the common electrode 153 facing the pixel electrode 151 may include a transparent electrode or a semi-transmissive electrode. When the common electrode 153 is a semi-transmissive electrode, the thickness thereof is reduced so that both reflection for resonance inside the organic functional layer 152 and transmission of light generated from the organic functional layer 152 through the organic common electrode 153 are possible. When the common electrode 153 is a semi-transmissive electrode, it may, for example, include a metal selected from silver (Ag), magnesium (Mg), aluminum (Al), ytterbium (Yb) and strontium (Sr), or silver (Ag), magnesium (Mg), aluminum (Al), ytterbium (Yb), and strontium (Sr), or a metal alloy including at least one metal.

As shown in FIGS. 2 and 3, the overhang structure ST is spaced apart from the bank 155 and is disposed inside the second hole B2 of the bank 155. The light-emitting display device according to the first embodiment of the present disclosure, as shown in FIGS. 2 and 3, has a relation equation of a second hole H2 of the second layer 140>a first hole H1 of the first layer 130>a second hole B2 of a bank, and the overhang structure ST is spaced by a smaller distance from the bank 155 than the second hole B2 to form an island shape.

The organic functional layer 152 has excellent straightness in the vertical direction during vapor deposition of the organic layer, but has poor step coverage in a region covered by the structure. Therefore, the organic functional layer 152 is formed around the overhang structure ST during deposition and formation thereof on the auxiliary wire 121 below the overhang structure ST, that is, on the undercut region UC, is difficult.

Meanwhile, the common electrode 153 includes a metal and has better step coverage characteristics than the organic functional layer 152, so that it overlaps the overhang structure ST around the overhang structure ST and is formed more inwardly than the organic functional layer 152 and is thus directly electrically connected to the auxiliary wire 121. More specifically, the auxiliary wire 121 may be connected to the common electrode 153 in the undercut region UC where the first pattern 135 under the second pattern 145 of the overhang structure ST is removed.

The second pattern 145 is disposed in an area small enough to expose a part of the width of the auxiliary wire 121 above the overhang structure ST. As shown in FIGS. 2 and 3, the second pattern 145 has a taper in which the thickness gradually decreases along the edge of the overhang structure ST from the center of the overhang structure ST and thus has a non-planarized surface. Therefore, the organic functional layer pattern 152A formed on the island-shaped second pattern 145 of the overhang structure ST has poor deposition uniformity than the organic functional layer 152 located in the flat emission portion (corresponding to the first bank hole B1), gradually becomes thinner along the edge from the center of the overhang structure ST, and has almost no thickness at the edge of the overhang structure ST. The organic functional layer 152 is not formed under the undercut region UC, and the organic functional layer pattern 152A and the organic functional layer 152 are separated from each other in the undercut region UC.

The common electrode pattern 153A on the organic functional layer pattern 152A of the overhang structure ST is formed to cover the top of the organic functional layer pattern 152A and is formed on the side of the first pattern 135 on the lower surface of the undercut region UC of the second pattern 145 to be partially connected to the common electrode 153 formed under the undercut region UC.

In the light-emitting display device of the present disclosure, even if the common electrode pattern 153A on the overhang structure ST is separated from the common electrode 153 around the overhang structure ST, the common electrode 153 is directly connected to the auxiliary wire 121 under the second pattern 145 of the overhang structure ST in the opening area OP. Therefore, the common electrode 153 in each exposed opening area OP of the auxiliary wire 121 in the light-emitting display device of the present disclosure can supply signals through electrical connection with the auxiliary wire 121 and further secure an electrical signal supply path in the display area, to prevent a voltage drop of the common electrode 153 and supply a uniform signal to the common electrode 153 without any variation between areas.

Meanwhile, a configuration not described with reference to FIG. 3 will be described.

The thin film transistor TFT has an active layer 105 on a substrate 100, a gate insulating film 106 on the active layer 105, a gate electrode 107 overlapping the channel region of the active layer 105, and a source electrode 108 and a drain electrode 109 connected to both sides of the active layer 105.

The auxiliary wire 121 of the present disclosure may include any one electrode constituting the thin film transistor TFT and may be formed in the same process. In the example of FIG. 3, the auxiliary wire 121 is disposed on the same layer as the source electrode 108 and the drain electrode 109, but is not limited thereto, and the auxiliary wire 121 may be formed on the same layer as the gate electrode 107.

The active layer 105 may include at least one of a crystalline silicon, amorphous silicon, or oxide semiconductor, and may be formed by stacking a plurality of semiconductor layers having different properties. The source electrode 108 and the drain electrode 109 and the active layer 105 maintain insulating properties in a region other than the connection portion via the interlayer insulating film 120 interposed therebetween.

The interlayer insulating film 120 may include at least one of an oxide film, a nitride film, or an oxynitride film, and may have a single layer or multiple layers.

As shown in the drawing, in the thin film transistor TFT, the gate electrode 107 may be disposed above the active layer 105, but is not limited thereto, and the gate electrode 107 may be disposed on the lower side and the active layer 105 may be disposed on the upper side.

The source electrode 108 and the drain electrode 109 may be formed on the same layer as the active layer 105.

The insulation stack INS has a layered structure that protects the thin film transistor TFT and is disposed on the thin film transistor TFT including the interlayer insulating film 120.

In addition, the encapsulation layer structure 160 is disposed on the upper part of the structure that protects the light-emitting element 150 and the overhang structure ST, protects the light-emitting element 150, and prevents moisture from entering the light-emitting element 150. The lowermost inorganic encapsulation layer 161 in the encapsulation layer structure 160 covers and protects the overhang structure ST spaced apart from the bank 155 in the opening area OP of the insulation stack INS and the common electrode 153 connected to the auxiliary wire 121 around the overhang structure ST. In this case, the lowermost inorganic encapsulation layer 161 of the encapsulation layer structure 160 fills the opening area OP of the insulation stack INS and protects an organic functional layer and the common electrode 153, which are components of the light-emitting element 150 around the overhang structure ST.

For example, the inorganic encapsulation layers 161 and 163 may include silicon nitride, aluminum nitride, zirconium nitride, titanium nitride, hafnium nitride, tantalum nitride, silicon oxide, aluminum oxide, titanium oxide, tin oxide, cerium oxide, silicon oxynitride (SiON), lithium fluoride, and the like. In addition, the organic encapsulation layer 162 may be formed of an acrylic resin, a methacrylic resin, polyisoprene, a vinyl resin, an epoxy resin, a urethane resin, a cellulose resin, a perylene resin or the like.

Here, when the protective electrode 154 is relatively exposed more compared to the bank 155, the protective electrode 154 may block permeation of impurities such as hydrogen from the lowermost inorganic encapsulation layer 161.

Hereinafter, a light-emitting display device according to a second embodiment of the present disclosure will be described.

Figure 4:
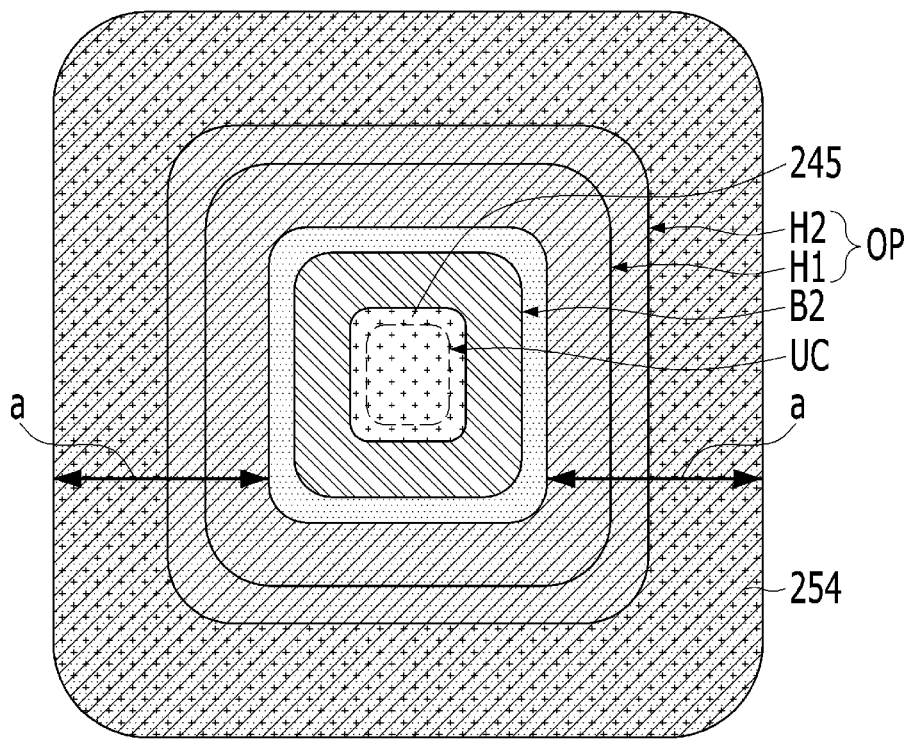
FIG. 4 is a cross-sectional view illustrating a light-emitting display device according to a second embodiment of the present disclosure.
Figure 5:
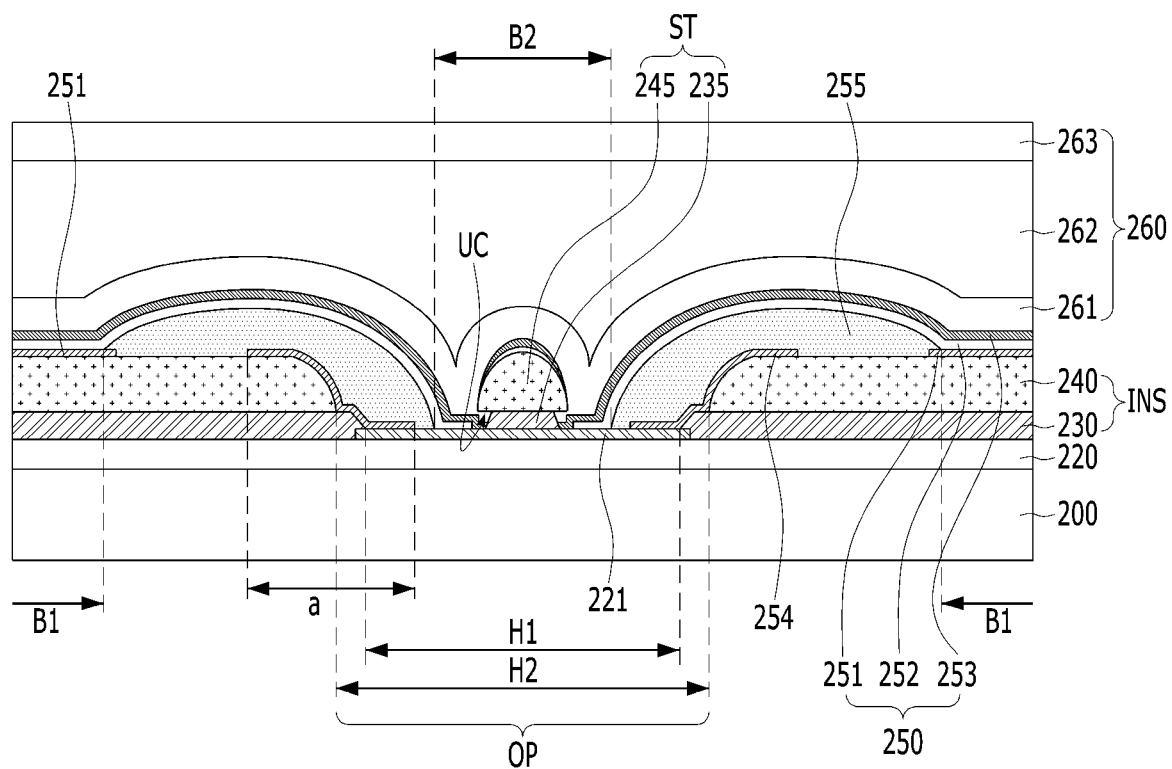
FIG. 5 is a cross-sectional view illustrating a cross-section taken along a horizontal center line of the region illustrated in FIG. 4, and a surrounding emission portion.

FIG. 4 is a cross-sectional view illustrating a light-emitting display device according to a second embodiment of the present disclosure and FIG. 5 is a cross-sectional view illustrating a cross-section taken along a horizontal center line of the region illustrated in FIG. 4, and a surrounding emission portion.

As shown in FIGS. 4 and 5, the light-emitting display according to the second embodiment of the present disclosure has a configuration in which the protective electrode 254 is completely covered with the bank 255 because the bank 255 further overlaps the opening area OP of the insulation stack INS including a first layer 230 of an inorganic insulating film and a second layer 240 of an organic insulating film, compared to the light-emitting display according to the first embodiment.

In the light-emitting display device according to the second embodiment of the present disclosure, the bank 255 includes not only the first bank hole B1 corresponding to the emission portion, but also a second bank hole B2 that is smaller than all of the first and second holes H1 and H2 in the opening area OP and covers the protective electrode 254 in the first hole H1 to protect the protective electrode 254 formed inside the opening area OP.

Here, the bank 255 and the first and second holes H1 and H2 of the insulation stack INS have the following relationship. That is, there is the relationship of the second hole B2 of the bank 255 exposing the overhang structure ST<the first hole H1 exposing the auxiliary wire 221 in the first layer of the insulation stack INS<the second hole H2 exposing the auxiliary wire 221 in the second layer of the insulation stack INS.

In addition, the protective electrode 254 is provided on the sidewall of the opening area OP of the interlayer insulation stack INS. That is, it is possible to prevent exposure of the second layer 240 that has a steep taper with the interface between the second layer 240 and the first layer 230 on the sidewall of the opening area OP and is vulnerable to moisture, during and after the process of forming the pixel electrode, and thereby to prevent permeation of moisture due to the exposed sidewall of the organic insulating film.

In the light-emitting display device according to the second embodiment of the present disclosure, the bank 255 broadly formed in the opening area OP completely covers the protective electrode 254, so that the organic functional layer 252 (deposited after formation of the bank 255) may be formed along the broad side surface of the bank 255 even within the opening area OP and may be formed to a uniform thickness on the bank 255. In the light-emitting display device according to the second embodiment of the present disclosure, the organic functional layer 252 is not deposited at the bottom of the undercut area UC protruding from the first pattern 235 of the second pattern 245 constituting the overhang structure ST and the common electrode 253 having better step coverage characteristics is formed closer to the first pattern 235 than the organic functional layer 252, so that the auxiliary wire 221 and the common electrode 253 are directly connected to each other.

The insulation stack INS is a layered structure formed on the substrate 200 while covering the thin film transistor (see TFT in FIG. 3). An interlayer insulating film 220 interposed between the active layer and the gate electrode or the source/drain electrode of the thin film transistor is further provided between the first layer 230 of the insulation stack INS and the substrate 200.

Inside the opening area OP of the insulation stack INS, an overhang structure ST is provided to be spaced apart from the sidewall of the insulation stack INS, and the bank 255 partially overlaps the opening area OP in the insulation stack INS and is spaced apart from the overhang structure ST.

The light-emitting element 250 includes a pixel electrode 251, an organic functional layer 252, and a common electrode 253.

An encapsulation layer structure 260 including inorganic encapsulation layers 261 and 263 and an organic encapsulation layer 262 between the inorganic encapsulation layers 261 and 263 may be provided on the common electrode 253.

In addition, the lowest inorganic encapsulation layer 261 in the encapsulation layer structure 260 covers and protects the overhang structure ST spaced apart from the bank 255 in the opening area OP of the insulation stack INS and the common electrode 253 connected to the auxiliary wire 221 around the overhang structure ST. In this case, the lowermost inorganic encapsulation layer 261 of the encapsulation layer structure 260 fills the opening area OP of the insulation stack INS and protects the organic functional layer and the common electrode 253, which are components of the light-emitting element 250 around the overhang structure ST.

In the light-emitting display device according to the second embodiment of the present disclosure, the organic functional layer 252 is formed to a uniform thickness on the overlapping bank 255 even inside the opening area OP of the insulation stack INS, thereby forming an overhang structure.

As a result, it is possible to prevent non-uniform film formation of the light-emitting element 250 in the region excluding the overhang structure ST and improve the uniformity of formation, thereby maintain vertical current uniformity of the light-emitting element 250.

Figure 6:
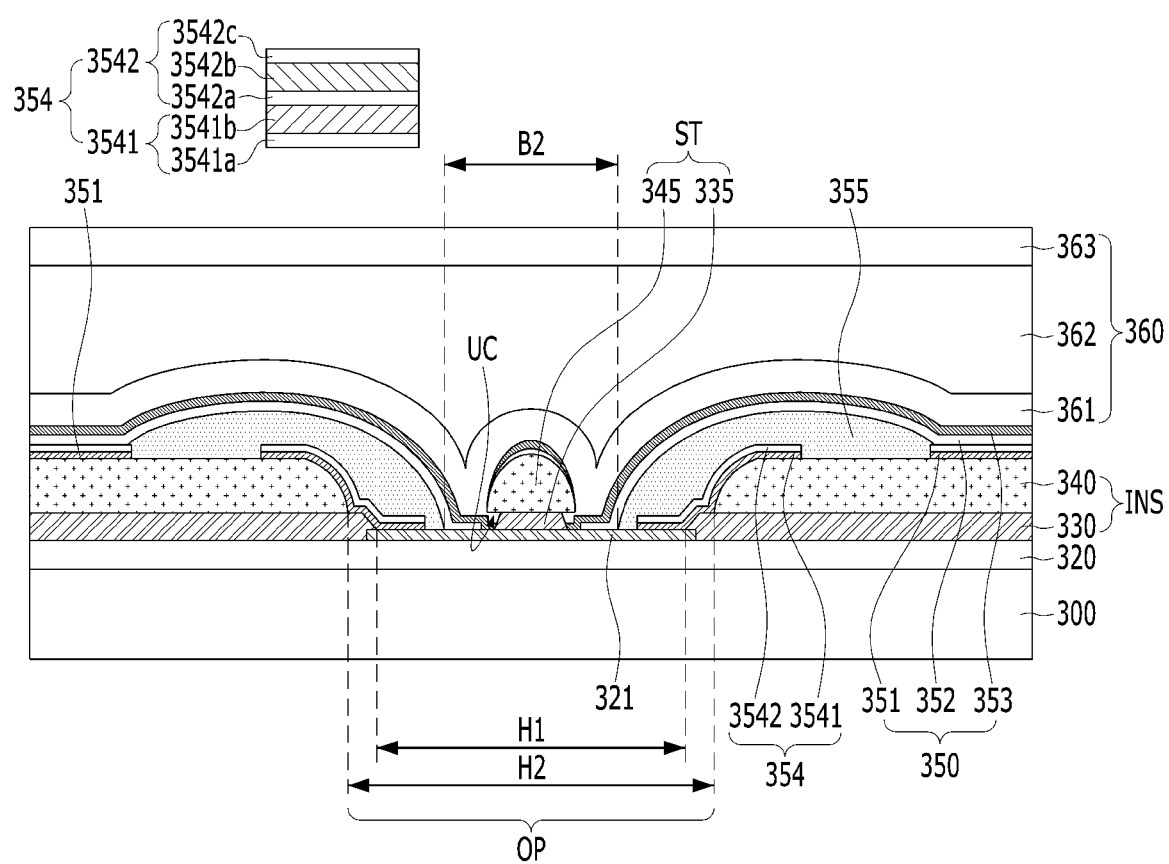
FIG. 6 is a cross-sectional view illustrating a light-emitting display device according to a third embodiment of the present disclosure.

FIG. 6 is a cross-sectional view illustrating a light-emitting display device according to a third embodiment of the present disclosure.

As shown in FIG. 6, the light-emitting display device according to the third embodiment of the present disclosure has a similar structure to the light-emitting display device of the second embodiment, except that the pixel electrode 351 and the protective electrode 354 include a first metal layer 3541 and a second metal layer 3542 having different properties.

The opening area OP of the insulation stack INS and the protective electrode 354 provided on the sidewalls of the opening area OP in the light-emitting display device according to the third embodiment of the present disclosure have the same planar configuration as the light-emitting element according to the second embodiment and differs in only the layer structure of the protective electrode 354.

Here, the bank 355 and the first and second holes H1 and H2 of the insulation stack INS have the following relationship: the second hole B2 of the bank 355 exposing the overhang structure ST<the first hole H1 exposing the auxiliary wire 321 in the first layer of the insulation stack INS<the second hole H2 exposing the auxiliary wire 321 in the second layer of the insulation stack INS. In addition, the second hole B2 of the bank 355 is formed outside the end of the protective electrode 354 to sufficiently cover the protective electrode 354 within the opening area OP.

The first metal layer 3541 of the pixel electrode 351 and the protective electrode 354 includes a first transparent metal layer 3541a and a hydrogen-shielding metal layer 3541b, and the second metal layer 3542 includes a second transparent metal layer 3542a, a reflective electrode layer 3542b, and a third transparent metal layer 3542c.

The protective electrode 354 is formed to cover the exposed sidewall of the insulation stack INS around the overhang structure ST of the insulation stack INS to prevent the side of the insulation stack INS from being exposed to the outside and thereby completely protect the second layer 340 of the organic insulating layer having high moisture and hydrogen delivery properties. In addition, when the pixel electrode 351 is formed, the side of the insulation stack INS where the etchant has flowability is protected, thereby preventing a phenomenon in which residues are deposited on the side of the insulation stack INS in the etching process and then act as the moisture permeation path during formation of the organic functional layer 352, the common electrode 353, and the encapsulation layer structure 360.

In the light-emitting display device according to the third embodiment of the present disclosure, the organic functional layer 352, which completely covers the protective electrode 354 and is deposited after forming the bank 355, is formed along the broad side of the bank 355 even in the opening area OP and is formed to a uniform thickness on the bank 355. In the light-emitting display device according to the third embodiment of the present disclosure, the organic functional layer 352 is non-deposited at the bottom of the undercut area UC protruding from the first pattern 335 of the second pattern 345 constituting the overhang structure ST and the common electrode 353 having better step coverage characteristics is formed closer to the first pattern 335 than the organic functional layer 352, so that the auxiliary wire 321 and the common electrode 353 are directly connected to each other.

The insulation stack INS is a layered structure formed on the substrate 300 while covering the thin film transistor (see TFT in FIG. 3). An interlayer insulating film 320 interposed between the active layer and the gate electrode or the source/drain electrode of the thin film transistor is further provided between the first layer 330 of the insulation stack INS and the substrate 300.

Inside the opening area OP of the insulation stack INS, an overhang structure ST is provided to be spaced apart from the sidewall of the insulation stack INS, and the bank 355 partially overlaps with the opening area OP in the insulation stack INS and is spaced apart from the overhang structure ST.

The light-emitting element 350 includes a pixel electrode 351, an organic functional layer 352, and a common electrode 353.

An encapsulation layer structure 360 including inorganic encapsulation layers 361 and 363 and an organic encapsulation layer 362 between the inorganic encapsulation layers 361 and 363 may be provided on the common electrode 353.

In the light-emitting display device according to the third embodiment of the present disclosure, the organic functional layer is formed to a uniform thickness on the overlapping bank 355 even inside the opening area OP of the insulation stack INS, thereby preventing non-uniform film formation of the light-emitting element 350 in the region excluding the overhang structure ST, improving the uniformity of formation, and maintaining vertical current uniformity of the light-emitting element 350. In addition, the protective electrode 354 includes a hydrogen-shielding electrode to protect the exposed second layer 340 of the insulation stack INS, and to effectively prevent transmission of moisture and hydrogen through the side of the second layer 340 during and after the process.

Figure 7:
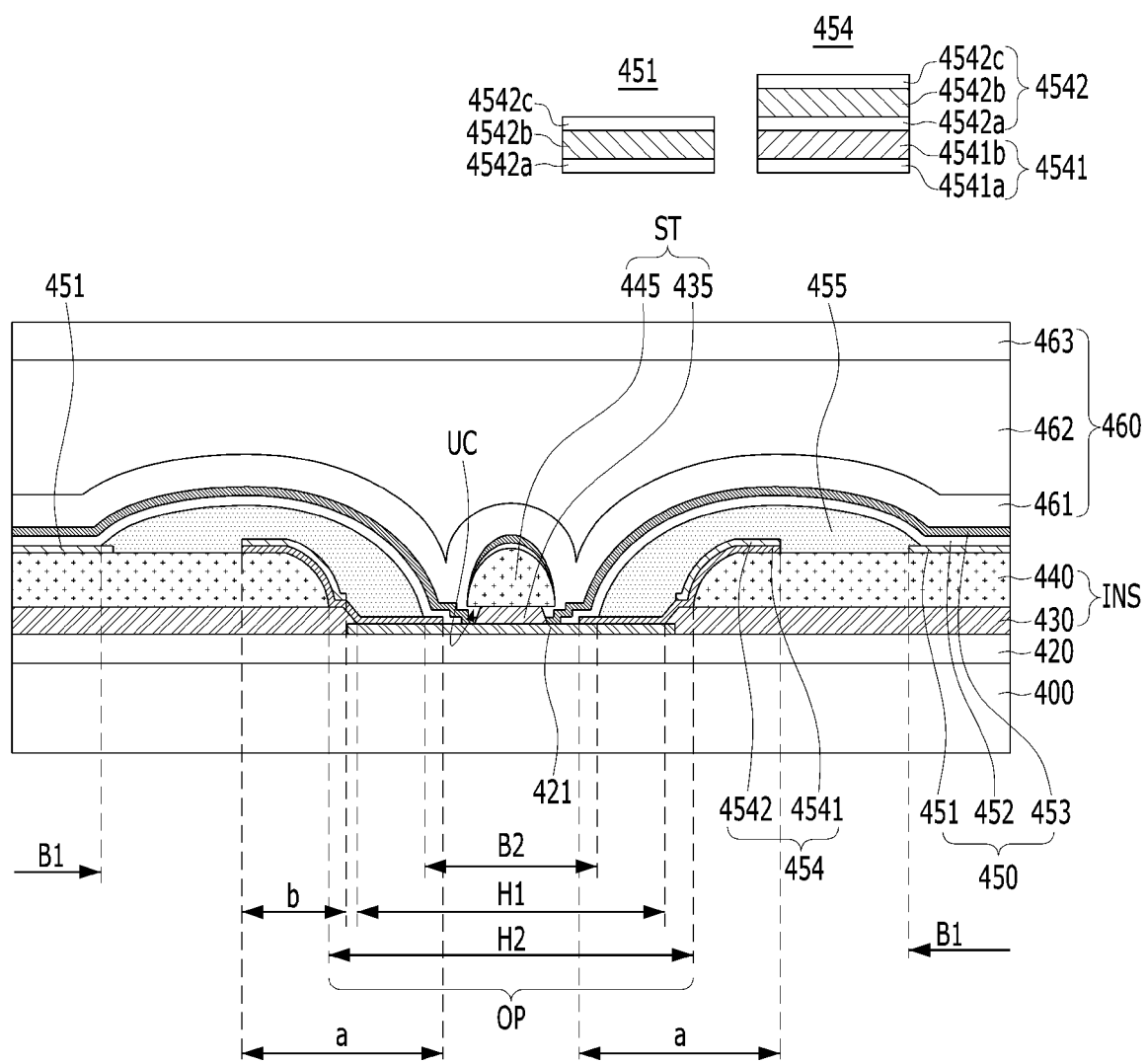
FIG. 7 is a cross-sectional view illustrating a light-emitting display device according to a fourth embodiment of the present disclosure.

FIG. 7 is a cross-sectional view illustrating a light-emitting display device according to a fourth embodiment of the present disclosure.

As shown in FIG. 7, the light-emitting display device according to the fourth embodiment of the present disclosure has a similar structure to the light-emitting display device of the first embodiment, except that the protective electrode 454 includes a first metal layer 4541 capable of shielding hydrogen and a second metal layer 4542 including a reflective electrode. In this case, the pixel electrode 451 may include only the configuration of the second metal layer 4542 including the reflective electrode.

Here, the bank 455 and the first and second holes H1 and H2 of the insulation stack INS have the following relationship: the second hole B2 of the bank 455 exposing the overhang structure ST<the first hole H1 exposing the auxiliary wire 421 in the first layer of the insulation stack INS<the second hole H2 exposing the auxiliary wire 421 in the second layer of the insulation stack INS. In addition, the second hole B2 of the bank 455 is formed outside the end of the protective electrode 454 to sufficiently cover the protective electrode 454 within the opening area OP. In this case, the first metal layer 4541 includes a moisture-shielding electrode such as MoTi to primarily block moisture and hydrogen generated from the outside of the bank 455 and to thereby prevent transfer of moisture and hydrogen to the bank 455 adjacent to the opening area OP and the insulation stack INS.

The first metal layer 4541 of the protective electrode 454 includes a first transparent metal layer 4541a and a hydrogen-shielding metal layer 4541b, and the second metal layer 4542 includes a second transparent metal layer 4542a, a reflective electrode layer 4542b, and a third transparent metal layer 4542c. Here, the pixel electrode 451 may be formed by stacking the second transparent metal layer 4542a, the reflective electrode layer 4542b, and the third transparent metal layer 4542c, like the second metal layer 4542 of the protective electrode 454.

Meanwhile, in the light-emitting display device according to the fourth embodiment of the present disclosure, in the width "a" of the first metal layer 4541 of the protective electrode 454 provided in the opening area OP of the insulation stack INS and the sidewall of the opening area OP, the planar arrangement of the light-emitting element is the same as the planar arrangement of the protection electrode 154. The width "b" of the second metal layer 4542 may be greater or smaller than the width "a" of the first metal layer 4541 and the second metal layer 4542 may contact the edge of the second hole H2 or may be embedded in the second hole H2 to effectively protect the sidewall of the second layer 440. In addition, the second metal layer 4542 may include a reflective metal component and is more preferably protected by the bank 255. That is, the width b of the second metal layer 4542 preferably has a relationship of width≤b≤a with the second layer 440 overlapping the first metal layer 4541.

The protective electrode 454 is formed to cover the exposed sidewall of the insulation stack INS around the overhang structure ST of the insulation stack INS to prevent the side of the insulation stack INS from being exposed to the outside and thereby completely protect the second layer 440 of the organic insulating layer having high moisture and hydrogen delivery properties. In addition, when the pixel electrode 451 is formed, the side of the insulation stack INS where the etchant has flowability is protected, thereby preventing a phenomenon in which residues are deposited on the side of the insulation stack INS in the etching process and then act as the moisture permeation path during formation of the organic functional layer 452, the common electrode 453, and the encapsulation layer structure 460.

In the light-emitting display device according to the fourth embodiment of the present disclosure, the broad bank 455 even in the opening area OP covers most of the protective electrode 454, the end of the first metal layer 4541 exposed from the bank 455 includes a hydrogen-shielding electrode, and the protective electrode 454 completely prevents hydrogen and moisture from passing through the side of the opening area OP in the insulation stack INS.

In the light-emitting display device according to the fourth embodiment of the present disclosure, the organic functional layer 452 is not deposited at the bottom of the undercut area UC protruding from the first pattern 435 of the second pattern 445 constituting the overhang structure ST and the common electrode 453 having better step coverage characteristics is formed closer to the first pattern 435 than the organic functional layer 452, so that the auxiliary wire 421 and the common electrode 453 are directly connected to each other.

The insulation stack INS is a layered structure formed on the substrate 400 while covering the thin film transistor (see TFT in FIG. 3). An interlayer insulating film 420 interposed between the active layer and the gate electrode or the source/drain electrode of the thin film transistor is further provided between the first layer 430 of the insulation stack INS and the substrate 400.

Inside the opening area OP of the insulation stack INS, an overhang structure ST is provided to be spaced apart from the sidewall of the insulation stack INS, and the bank 455 partially overlaps with the opening area OP in the insulation stack INS and is spaced apart from the overhang structure ST.

The light-emitting element 450 includes a pixel electrode 451, an organic functional layer 452, and a common electrode 453.

An encapsulation layer structure 460 including inorganic encapsulation layers 461 and 463 and an organic encapsulation layer 462 between the inorganic encapsulation layers 461 and 463 may be provided above the common electrode 453.

In the light-emitting display device according to the fourth embodiment of the present disclosure, the organic functional layer is formed to a uniform thickness on the overlapping bank 455 even inside the opening area OP of the insulation stack INS, thereby preventing non-uniform film formation of the light-emitting element 450 in the region excluding the overhang structure ST and improving the uniformity of formation, and maintaining vertical current uniformity of the light-emitting element 450. In addition, the protective electrode 454 includes a hydrogen-shielding electrode to protect the exposed second layer 440 of the insulation stack INS, and to protect transmission of moisture and hydrogen through the side of the second layer 440 during and after the process.

Hereinafter, a method of manufacturing a light-emitting display device according to an embodiment of the present disclosure will be described with reference to process cross-sectional views.

FIGS. 8A to 8G are process cross-sectional views illustrating a method of manufacturing a light-emitting display device according to an embodiment of the present disclosure.

Figure 8A:
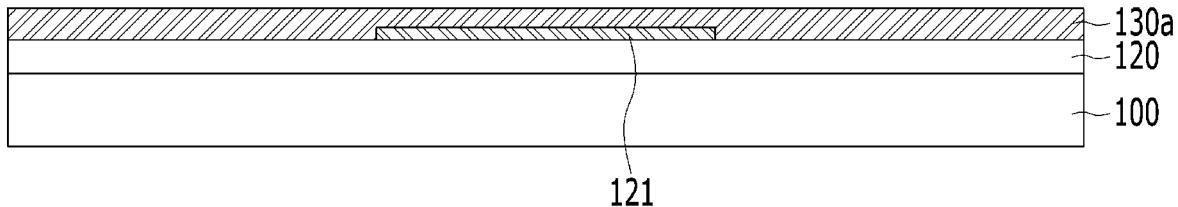
FIGS. 8A to 8G are cross-sectional views illustrating a method of manufacturing a light-emitting display device according to an embodiment of the present disclosure.

In the method of manufacturing a light-emitting display device according to the embodiment of the present disclosure, first, as shown in FIG. 8A, an interlayer insulating film 120 is formed on a substrate 100 and an auxiliary wire 121 is provided thereon. Here, the interlayer insulating film 120 may be provided between electrode layers disposed between different layers of the thin film transistor TFT.

In addition, as shown in FIG. 1, the auxiliary wire 121 may be formed long while crossing a display area AA in a horizontal direction or a vertical direction.

Subsequently, a first layer material 130a of an inorganic insulating film component covering the thin film transistor (see TFT in FIG. 3) covering the auxiliary wire 121 is formed.

Figure 8B:
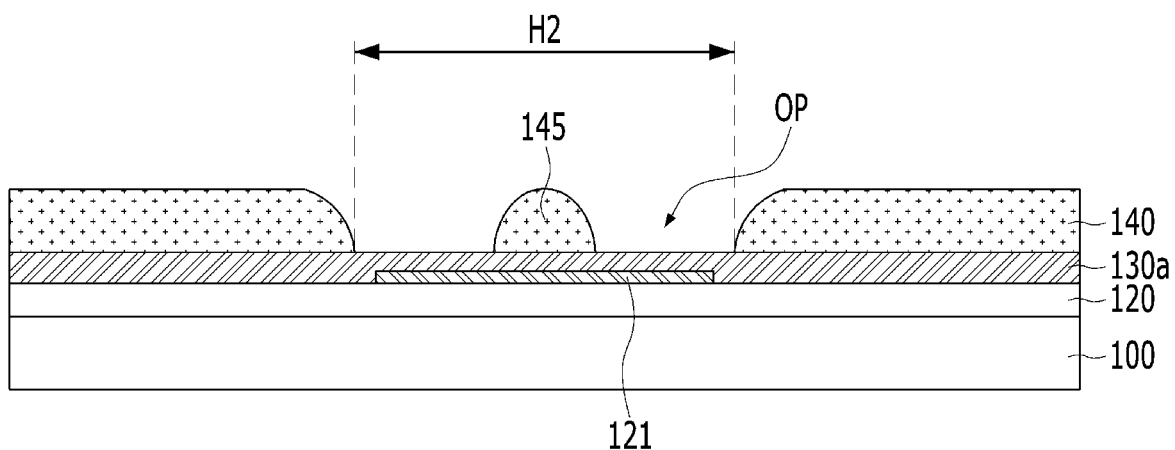

Subsequently, as shown in FIG. 8B, an organic insulating film component is patterned on the first layer material 130a to form a second layer 140. Here, a second hole H2 is formed in the second layer 140 and an island-like second pattern 145 is formed in the center of the second hole H2. The region inside the second hole H2 is used as an opening area OP of the insulation stack INS.

Figure 8C:
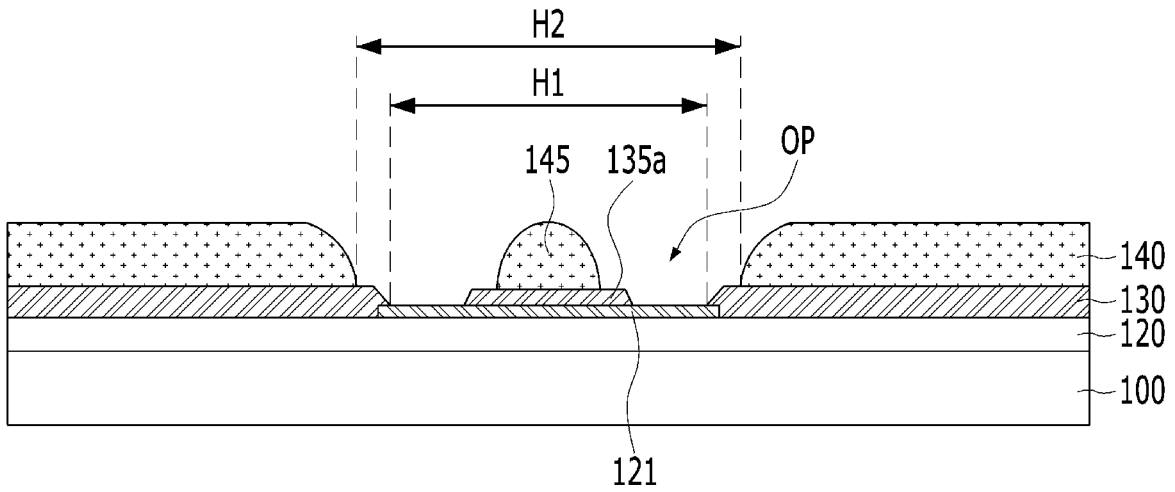
Figure 8D:
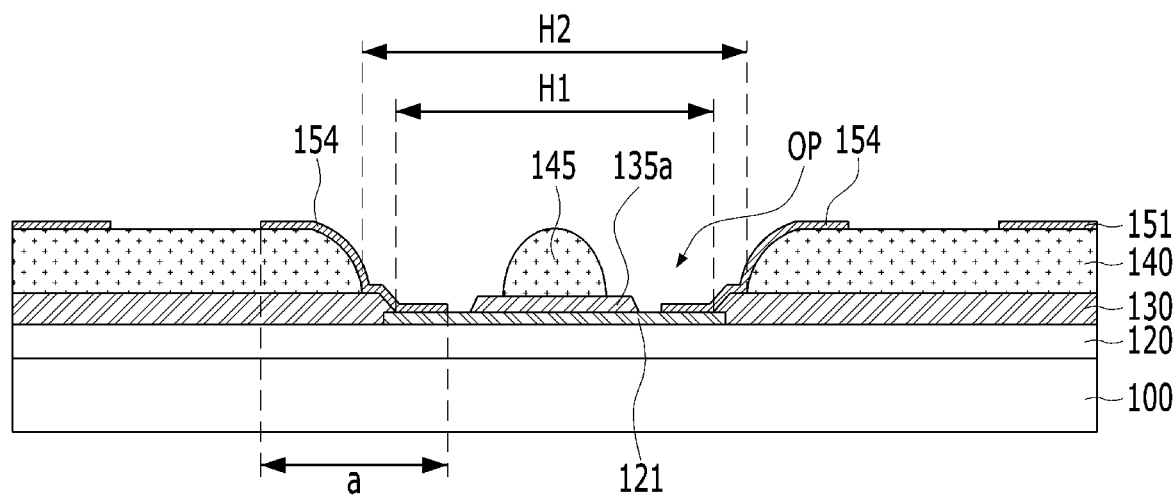

Subsequently, as shown in FIG. 8C, the first layer material 130a is patterned using the second layer 140 and the island-like second pattern 145 as masks to form a first layer 130 having a first hole H1 inside the second hole H2. The patterned first layer 130 has a material characteristic different from that of the second layer 140, so that the first layer 130 remains in a greater width than the second layer 140 and has a first hole H1 smaller than the second hole H2. In addition, the first pattern material 135a having a greater width than the second pattern 145 remains below the island-like second pattern 145. That is, through this process, the first layer material 130a is patterned to further form the first hole H1 in the opening area OP.

Subsequently, a pixel electrode material layer is deposited over the entire surface of the insulation stack INS where the second hole H2 is formed and selectively removed to form a pixel electrode 151 and a closed loop-shaped protective electrode 154 with a width of "a" that is spaced from the pixel electrode 151 and the island-shaped second pattern 145, and overlaps the sidewall of the opening area OP. The pixel electrode 151 and the protective electrode 154 may be formed of the same material as in the first to third embodiments and the protective electrode 454 may include a metal electrode different from the pixel electrode 451 on the lower side thereof, as in the fourth embodiment.

Here, it is possible to protect the exposed side portion around the opening area OP of the insulation stack INS with the protective electrode 154, to prevent the use, as a path for moisture permeation, of the insulation stack INS at the side of the opening area OP exposed during an etching process for forming the pixel electrode 151, and to prevent etchant and residual materials from etching from being left on the non-uniform surface of the side of the opening area OP.

Figure 8E:
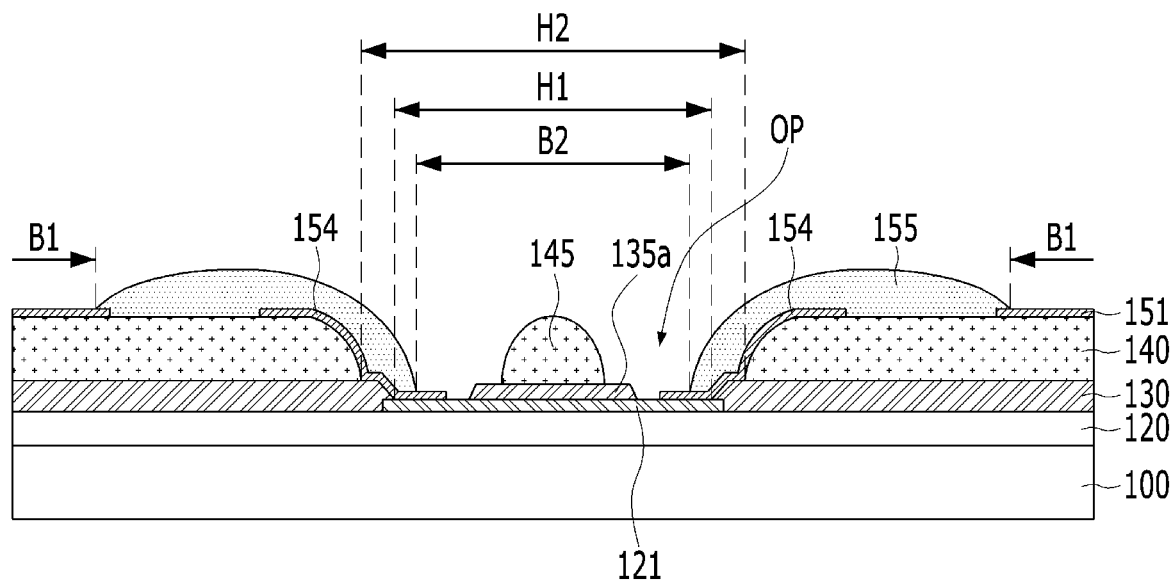

As shown in FIG. 8E, a bank 155 having a first bank hole B1 exposing the pixel electrode 151 corresponding to the emission portion and a second bank hole B2 overlapping part or all of the protective electrode 154 and exposing the second pattern 145 and the first pattern material 135a spaced apart by a predetermined distance in the opening area OP is formed.

Figure 8F:
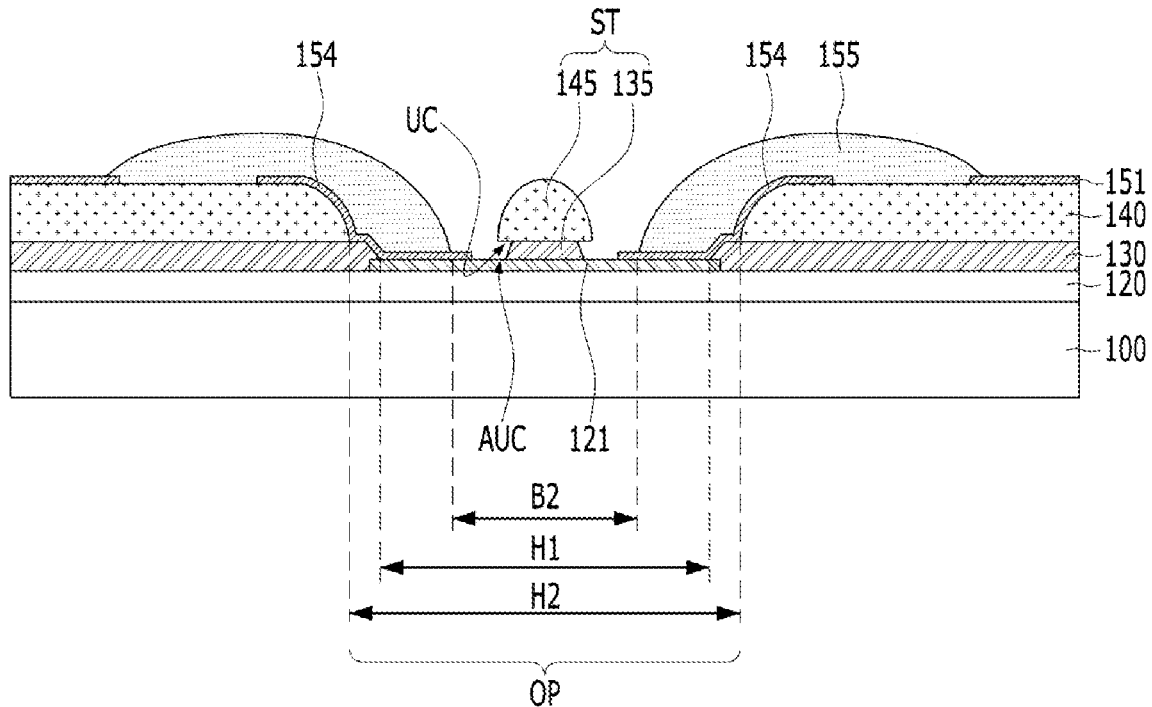

Subsequently, as shown in FIG. 8F, the first pattern material 135a under the second pattern 145 is etched to form an undercut region UC at the edge of the second pattern 145. Here, a portion of the auxiliary wire 121 exposed around the undercut region UC is used as a connection portion AUC connected to the common electrode when forming the common electrode in the subsequent process.

Figure 8G:
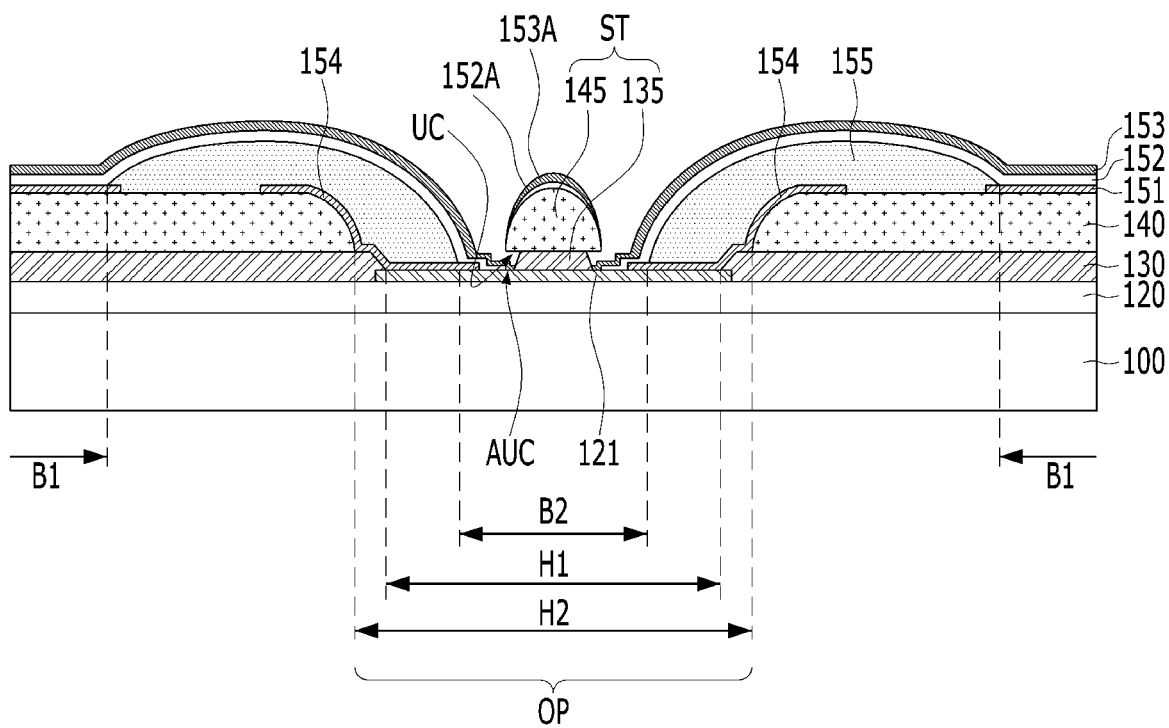

Then, as shown in FIG. 8G, the organic functional layer 152 and the common electrode 153 are sequentially formed using a common mask.

The organic functional layer 152 and the common electrode 153 have different deposition characteristics in the undercut region UC due to the difference in step coverage characteristics, and thus the common electrode 153 is connected to the auxiliary wiring 121 in the connection portion AUC.

In the light-emitting display device according to the present disclosure, an insulation stack is patterned to prepare an opening area in the insulation stack and an overhang structure is applied to the opening area, thereby connecting the auxiliary electrode to the common electrode around the overhang structure, uniformizing the voltage of the common electrode for each region, and preventing a voltage drop.

In addition, the exposed sidewall of the insulation stack surrounding the opening area is covered with the protective electrode, thereby preventing exposure of the insulation stack around the opening area when forming the pixel electrode, and preventing the portion of the insulation stack that is vulnerable to moisture from being exposed to outside air.

In addition, it is possible to prevent the pixel electrode material from remaining at the sidewalls of non-uniform insulation stacks during etching. As a result, without direct exposure of the insulation stack around the overhang structure, the inside and side walls of the insulation stack are disposed as protective electrodes and auxiliary wires, or as protective electrodes, banks and auxiliary wires, so that the organic functional layer and the common electrode can be stably deposited around the overhang structure after the formation of protective electrodes.

As apparent from the foregoing, the light-emitting display device and the method of manufacturing the same according to the present disclosure have the following effects.

The light-emitting display device according to the present disclosure is capable of uniformizing the voltage of the common electrode for each region and preventing a voltage drop by patterning an insulation stack to prepare an opening area in the insulation stack and applying an overhang structure to the opening area to connect the auxiliary electrode to the common electrode around the overhang structure.

In addition, the light-emitting display device according to the present disclosure is capable of preventing exposure of the insulation stack around the opening area when forming the pixel electrode and preventing the pixel electrode material from remaining on the non-uniform sidewall of the insulation stack by covering the exposed sidewall of the insulation stack surrounding the opening area with the protective electrode. Therefore, without direct exposure of the insulation stack around the overhang structure, the inside and side walls of the insulation stack are disposed as protective electrodes and auxiliary wires, or as protective electrodes, banks and auxiliary wires, so that the organic functional layer and the common electrode can be stably deposited around the overhang structure after the formation of protective electrodes.

In addition, the sidewall of the insulation stack covered with the protective electrode has the same surface characteristics as the sidewall of the insulation stack, so that the coverage characteristics of the encapsulation layer formed on the light-emitting element can be improved.

The light-emitting display device according to an embodiment of the present disclosure may include an auxiliary wire on a substrate, an insulation stack having an opening area exposing a part of the auxiliary wire, an overhang structure spaced apart from the insulation stack in the opening area, and a protective electrode being spaced apart from the overhang structure and contacting a sidewall of the insulation stack surrounding the opening area.

The protective electrode may have a closed loop shape overlapping with a partial width of the auxiliary wire through the sidewall of the insulation stack at an edge of the opening area.

The protective electrode may comprise a center electrode layer with reflectivity, and a transparent electrode layer above and below the center electrode layer.

The protective electrode may comprise a hydrogen-shielding electrode.

A light-emitting element including a pixel electrode, an organic functional layer, and a common electrode may be disposed on the insulation stack. The protective electrode may be spaced apart from the pixel electrode and comprise the same material as the pixel electrode.

The common electrode may be connected to the auxiliary wire around the overhang structure in the opening area.

The insulation stack may comprise a first layer having a first hole in the opening area, and a second layer having a hole wider than the first hole on the first layer. The protective electrode may extend continuously on a sidewall of the first hole and a sidewall of the second hole. The protective electrode may be connected to the auxiliary wire.

The overhang structure may comprise a first pattern spaced apart from the first layer and formed of the same material as the first layer in the first hole, and a second pattern spaced apart from the second layer and formed of the same material as the second layer in the second hole. The first pattern may have a smaller area than the second pattern at an interface between the first pattern and the second pattern.

The common electrode continuously connected to a plurality of sub-pixels of the substrate may be connected to the auxiliary wire under the second pattern outside the first pattern.

A bank may expose the emission portion of the light-emitting element and cover the protective electrode.

The protective electrode may have a tip protruding from the bank in the opening area.

The protective electrode may comprise a first electrode layer including the tip, and a second electrode layer covered with the bank.

The first electrode layer may comprise a titanium alloy layer. The second electrode layer may comprise a center electrode layer formed of silver or a silver alloy layer, and a transparent electrode layer above and below the center electrode layer.

The tip may comprise at least one layer of hydrogen-shielding electrode.

And, the light-emitting display device according to an embodiment of the present disclosure may include a substrate including a display area having a plurality of emission portions spaced apart from each other and a non-active area around the display area, an auxiliary wire between the emission portions, an insulation stack having an opening area exposing a part of the auxiliary wire, an overhang structure spaced apart from the insulation stack in the opening area, a protective electrode spaced apart from the overhang structure, the protective electrode contacting a sidewall of the opening area and the auxiliary wire, a plurality of pixel electrodes corresponding to at least the plurality of emission portions on the insulation stack, the pixel electrodes spaced apart from the protective electrode, a bank exposing the emission portions of the pixel electrodes and overlapping the protective electrode, and a common electrode in the display area. The common electrode may be connected to the auxiliary wire around the overhang structure. An organic functional layer may be disposed between each pixel electrode and the common electrode.

The protective electrode may include the same material as the pixel electrode.

The protective electrode may further comprise a tip protruding from the bank in the opening area.

The bank may comprise a bank hole exposing the overhang structure in the opening area. The protective electrode may be completely covered with the bank around the bank hole.

An encapsulation structure may be disposed on the common electrode. At least one layer of the encapsulation structure may be disposed in the opening area.

A method of manufacturing a light-emitting display device according to an embodiment of the present disclosure may include providing an auxiliary wire on a substrate, laminating a first insulating layer and a second insulating layer, patterning the second insulating layer and the first insulating layer to form an insulation stack having an opening area exposing a part of the auxiliary wire and a first structure spaced apart from the insulation stack in the opening area, patterning a protective electrode material to provide a protective electrode on a sidewall of the insulation stack surrounding the opening area, and forming an overhang structure in which the first insulating layer of the first structure is narrower than the lower area of the second insulating layer.

During the providing the protective electrode, a pixel electrode may be formed on the insulating stack.

Between forming the first structure and forming the overhang structure, a bank exposing an emission portion of the pixel electrode and overlapping the protective electrode may be formed.

It will be apparent to those skilled in the art that various modifications and variations can be made in the present disclosure without departing from the spirit or scope of the disclosure. Thus, it is intended that the present disclosure covers such modifications and variations thereto, provided they fall within the scope of the appended claims and their equivalents.

What is claimed is:

1. A light-emitting display device comprising:
an auxiliary wire on a substrate;
an insulation stack having an opening area exposing a part of the auxiliary wire;
an overhang structure spaced apart from the insulation stack in the opening area; and
a protective electrode spaced apart from the overhang structure, the protective electrode contacting a sidewall of the insulation stack surrounding the opening area.

2. The light-emitting display device according to claim 1, wherein the protective electrode has a closed loop shape overlapping with a partial width of the auxiliary wire through the sidewall of the insulation stack at an edge of the opening area.

3. The light-emitting display device according to claim 1, wherein the protective electrode comprises:
a center electrode layer with reflectivity; and
a transparent electrode layer above and below the center electrode layer.

4. The light-emitting display device according to claim 1, wherein the protective electrode comprises a hydrogen-shielding electrode.

5. The light-emitting display device according to claim 1, further comprising a light-emitting element including a pixel electrode, an organic functional layer, and a common electrode on the insulation stack,
wherein the protective electrode is spaced apart from the pixel electrode and comprises the same material as the pixel electrode.

6. The light-emitting display device according to claim 5, wherein the common electrode is connected to the auxiliary wire around the overhang structure in the opening area.

7. The light-emitting display device according to claim 1, wherein the insulation stack comprises:
a first layer having a first hole in the opening area; and
a second layer having a hole wider than the first hole on the first layer,
wherein the protective electrode extends continuously on a sidewall of the first hole and a sidewall of the second hole, and the protective electrode is connected to the auxiliary wire.

8. The light-emitting display device according to claim 7, wherein the overhang structure comprises:
a first pattern spaced apart from the first layer and formed of the same material as the first layer in the first hole; and
a second pattern spaced apart from the second layer and formed of the same material as the second layer in the second hole,
wherein the first pattern has a smaller area than the second pattern at an interface between the first pattern and the second pattern.

9. The light-emitting display device according to claim 8, wherein the common electrode continuously connected to a plurality of sub-pixels of the substrate is connected to the auxiliary wire under the second pattern outside the first pattern.

10. The light-emitting display device according to claim 5, further comprising a bank exposing an emission portion of the light-emitting element and covering the protective electrode.

11. The light-emitting display device according to claim 10, wherein the protective electrode has a tip protruding from the bank in the opening area.

12. The light-emitting display device according to claim 11, wherein the protective electrode comprises:
a first electrode layer including the tip; and
a second electrode layer covered with the bank.

13. The light-emitting display device according to claim 12, wherein the first electrode layer comprises a titanium alloy layer, and
wherein the second electrode layer comprises:
a center electrode layer formed of silver or a silver alloy layer; and
a transparent electrode layer above and below the center electrode layer.

14. The light-emitting display device according to claim 11, wherein the tip comprises at least one layer of hydrogen-shielding electrode.

15. A light-emitting display device comprising:
a substrate including a display area and a non-active area around the display area, the display area including a plurality of emission portions spaced apart from each other;
an auxiliary wire between the emission portions;
an insulation stack having an opening area exposing a part of the auxiliary wire;
an overhang structure spaced apart from the insulation stack in the opening area;
a protective electrode spaced apart from the overhang structure, the protective electrode contacting a sidewall of the opening area and the auxiliary wire;
a plurality of pixel electrodes corresponding to at least the plurality of emission portions on the insulation stack, the pixel electrodes spaced apart from the protective electrode;
a bank exposing the emission portions of the pixel electrodes and overlapping the protective electrode; and
a common electrode in the display area, the common electrode connected to the auxiliary wire around the overhang structure, and an organic functional layer disposed between each pixel electrode and the common electrode.

16. The light-emitting display device according to claim 15, wherein the protective electrode further comprises a tip protruding from the bank in the opening area.

17. The light-emitting display device according to claim 15, wherein the bank comprises a bank hole exposing the overhang structure in the opening area, and
wherein the protective electrode is completely covered with the bank around the bank hole.

18. A method of manufacturing a light-emitting display device comprising:
providing an auxiliary wire on a substrate;
laminating a first insulating layer and a second insulating layer;
patterning the second insulating layer and the first insulating layer to form an insulation stack having an opening area exposing a part of the auxiliary wire and a first structure spaced apart from the insulation stack in the opening area;
patterning a protective electrode material to provide a protective electrode on a sidewall of the insulation stack surrounding the opening area; and
forming an overhang structure in which an area of the first insulating layer of the first structure is smaller than an area of a lower part of the second insulating layer.

19. The method according to claim 18, wherein the providing the protective electrode further comprises forming a pixel electrode on the insulating stack.

20. The method according to claim 19, further comprising:
forming a bank exposing an emission portion of the pixel electrode and overlapping the protective electrode between forming the first structure and forming the overhang structure.

* * * * *